United States Patent
Chen

[19]

[11] Patent Number: 6,156,619
[45] Date of Patent: Dec. 5, 2000

[54] SEMICONDUCTOR DEVICE AND METHOD OF FABRICATING

[75] Inventor: Shih-Chang Chen, Tokyo, Japan

[73] Assignee: Oki Electric Industry Co., Ltd., Tokyo, Japan

[21] Appl. No.: 09/106,263

[22] Filed: Jun. 29, 1998

[51] Int. Cl.[7] ........................................... H01L 21/20
[52] U.S. Cl. .................... 438/396; 438/768; 438/775; 438/658
[58] Field of Search ........................ 438/658, 656, 438/666, 396, 768, 775, 253, 240

[56] References Cited

U.S. PATENT DOCUMENTS

| | | |
|---|---|---|
| 5,102,820 | 4/1992 | Chiba . |
| 5,122,923 | 6/1992 | Matsubara et al. . |
| 5,371,700 | 12/1994 | Hamada . |
| 5,407,855 | 4/1995 | Maniar et al. . |

FOREIGN PATENT DOCUMENTS 5304250  11/1993  Japan .

OTHER PUBLICATIONS

Anonymous, "Low Temperature Selective Nitridization of Metals in Polycide Stack Structures" Research Disclosure, No. 344107, Dec. 1992.

Y. Ohno et al., "A Memory Cell Capacitor with BaxSr1–xTiO3(BST) Film for Advanced DRAMs" 1994 Symposium on VLSI Technology Digest of Technical Papers, pp. 149–150.

Primary Examiner—Caridad Everhart
Attorney, Agent, or Firm—Jones Volentine, LLC

[57] ABSTRACT

A capacitor in a semiconductor device is constituted by a lower electrode having a laminated layer including an adhesive layer formed on an insulating film, a barrier layer formed so as to cover the upper surface of the insulating layer, a nitride side formed so as to cover the side face of the adhesive layer, and an electrode layer formed so as to cover the upper surface of the barrier layer, a capacitor insulating film formed so as to cover the upper surface and side surface of the lower electrode, and an upper electrode formed so as to cover the surface of the capacitor insulating film.

20 Claims, 10 Drawing Sheets

SEMICONDUCTOR DEVICE AND METHOD OF FABRICATING

BACKGROUND OF THE INVENTION

1. Field of the Invention

The present invention relates to a semiconductor device and method of fabricating it, and, in more detail, relates to a semiconductor device and method of fabrication provided with a capacitor of a simple stacked structure in which a ferroelectric film or insulating film of high relative permittivity is employed as the capacitor insulating film.

2. Description of the Related Art

In recent years, advances have been made in achieving higher integration and higher densities of semiconductor devices such as for example DRAMs (Dynamic Random Access Memories). Increasing the density and increasing the integration of a semiconductor device tends to decrease capacitance, lowering the reliability of the semiconductor device.

An effective method of increasing the capacitance of a capacitor of small area is to employ a ferroelectric film or insulator film of high relative permittivity as the capacitor insulating film. $Ta_2O_5$, $SrTiO_3$, $(Ba_{(x)}Sr_{(1-x)})TiO_3$ etc. are considered promising as insulator films of high relative permittivity used for capacitor insulating films. These insulating films have no hysteresis characteristic and have extremely high relative permittivity. The necessary capacitance can thereby be ensured, without making the construction of the capacitor device complicated, by employing these as the capacitor insulating film.

A known example of the construction of a capacitor in which a high relative permittivity insulating film is employed as the capacitor insulating film is shown in FIG. 1 of Y. Ohno et al, "A Memory Cell Capacitor With $Ba_{(x)}Sr_{(1-x)}TiO_3$(BST) Film For Advanced DRAMs" 1994 Symposium on VLSI Technology Digest of Technical Papers, 11.1, p.149.

A method of fabricating a capacitor as disclosed in this article will now be described with reference to FIG. 9.

First of all, a contact plug 902 is formed in a prescribed position of inter-layer insulating film 901, using the ordinary photolithographic technique and deposition techniques. This contact plug 902 is employed as a contact for the lower electrode (corresponding to the storage node).

Next, a laminated film 903 is formed (see FIG. 9(A)) on the surface of inter-layer insulating film 901 so as to contact this contact plug 902. This laminated film 903 is processed in a subsequent step to form the lower electrode. Laminated film 903 is constituted of an adhesive layer 904 to prevent peeling of the lower electrode from the inter-layer insulating film 901, a barrier layer 905 for preventing diffusion of carrier within the lower electrode, and an electrode layer 906. For example, a titanium (Ti) film can be employed for adhesive layer 904, a titanium nitride (TiN) film can be employed for the barrier layer, and a ruthenium (Ru) film can be employed for the lower electrode layer 906.

Next, lower electrode 907 is formed by patterning of laminated film 903 by RIE (Reactive Ion Etching) or a similar technique. After this, a side wall 908 (see FIG. 9(B)) is formed on the side face of lower electrode 907 by etching using RIE etc. after deposition of an insulating material on the entire surface of inter-layer insulating film 901.

Next, capacitor insulating film 909 is formed by depositing a $Ta_2O_5$, $SrTiO_3$ or $(Ba_{(x)}Sr_{(1-x)})TiO_3$ on the surface of inter-layer insulating film 901, lower electrode 907 and side wall 908. The capacitor is completed (see FIG. 9(C)) by forming an upper electrode 910 by depositing for example Ru on the entire surface of insulating film 909.

FIG. 9(D) is a view showing part of the capacitor of FIG. 9(C) to a larger scale. In this capacitor, the step coverage of insulating film 909 is improved by forming side walls 908 on the side faces of lower electrode 907, thereby preventing short circuiting of lower electrode 907 and upper electrode 910. Also, oxidation of adhesive layer 904 by annealing performed in a subsequent step is prevented by the provision of these side walls 908.

However, this gives rise to the drawback that, if a side wall 908 is formed on the side face of lower electrode 903, the capacitance of the capacitor is lowered, since the contact area of electrode 903 and insulating film 909 becomes small.

If a side wall 908 is provided, only the upper surface of lower electrode 907 acts as a storage node; the side face does not act as a storage node (see FIG. 9(D)). That is, since the area of the storage node is decreased to the extent of the area of the side face, the capacitance is lowered to that extent. Consequently, even by employing a ferroelectric film or high relative permittivity insulating film as capacitor insulating film 909, it was still not possible to raise the capacitance sufficiently.

SUMMARY OF THE INVENTION

An object of the present invention is to provide a semiconductor device and method of fabricating it whereby short circuiting of the upper electrode and lower electrode can be prevented, oxidation of the adhesive layer in the annealing step can be prevented, and whereby a capacitor can be provided that is of small area yet sufficiently large capacitance.

Also, a further object of the present invention is to provide a semiconductor device and method of fabricating it whereby oxidation of the adhesive layer can be prevented and a capacitor whereby sufficiently large capacitance can be obtained can be formed with small area and low cost.

A semiconductor device according to the present invention has a capacitor comprising a lower electrode having a laminated layer including an adhesive layer formed on an insulating film, a barrier layer formed so as to cover the upper surface of the adhesive layer, a nitride side formed so as to cover the side surface of the adhesive layer, and an electrode formed so as to cover the upper surface of the barrier layer, a capacitor insulating film formed so as to cover the upper surface and side surface of the lower electrode, and an upper electrode formed so as to cover the surface of the capacitor insulating film. With a semiconductor device according to the present invention, oxidation of the adhesive layer is prevented since the upper surface of the adhesive layer is covered by the barrier layer and the side surface of the adhesive layer is covered by the nitride side. Consequently, oxidation of the adhesive layer can be prevented even without the provision of a side wall. Since a side wall is not provided, the side face of the laminated layer can be employed as a storage node, so the capacitance can be increased. In a desirable mode of this invention, the lower electrode is further provided with a side electrode covering the side face of the laminated layer. By means of this side electrode, the step coverage of the capacitor insulating film can be increased, thereby preventing short circuiting of the lower electrode and upper electrode. Also, thanks to the provision of a side electrode, the area of the storage node can be further increased and so capacitance can be further increased.

A method according to the present invention of fabricating a semiconductor device includes a capacitor fabricating process comprising: a lower electrode forming process having a step of depositing a film for forming an adhesive layer using a non-nitrided conducting material on an insulating film, a step of depositing a film for forming a barrier layer using a conductive material formed by nitriding said non-nitrided conductive material on the surface of said non-nitrided conductive material film, a step of depositing a film for forming an electrode layer using a conductive material that is difficult to nitride on the surface of said nitrided conductive material film, a step of forming said adhesive layer, said barrier layer and said electrode layer by patterning these films, and a step of forming a nitride side on the side face of said adhesive layer by heating these layers in an atmosphere of nitrogen gas; a process of forming a capacitor insulating film by depositing an insulating material so as to cover the upper surface and side surface of said lower electrode; and a process of forming an upper electrode by depositing a conductive material so as to cover the surface of said capacitor insulating film. With the method of fabricating a semiconductor device according to the present invention, a capacitor having a nitride side can be fabricated cheaply with a simple fabricating step. In a preferred mode of the present invention, there is further added a step of simply forming a side electrode on the lower electrode.

BRIEF DESCRIPTION OF THE DRAWINGS

The foregoing and other objects, features and advantages of the present invention will be better understood from the following description connection with the accompanying drawings, in which.

DESCRIPTION OF THE PREFERRED EMBODIMENTS

Figure 1:
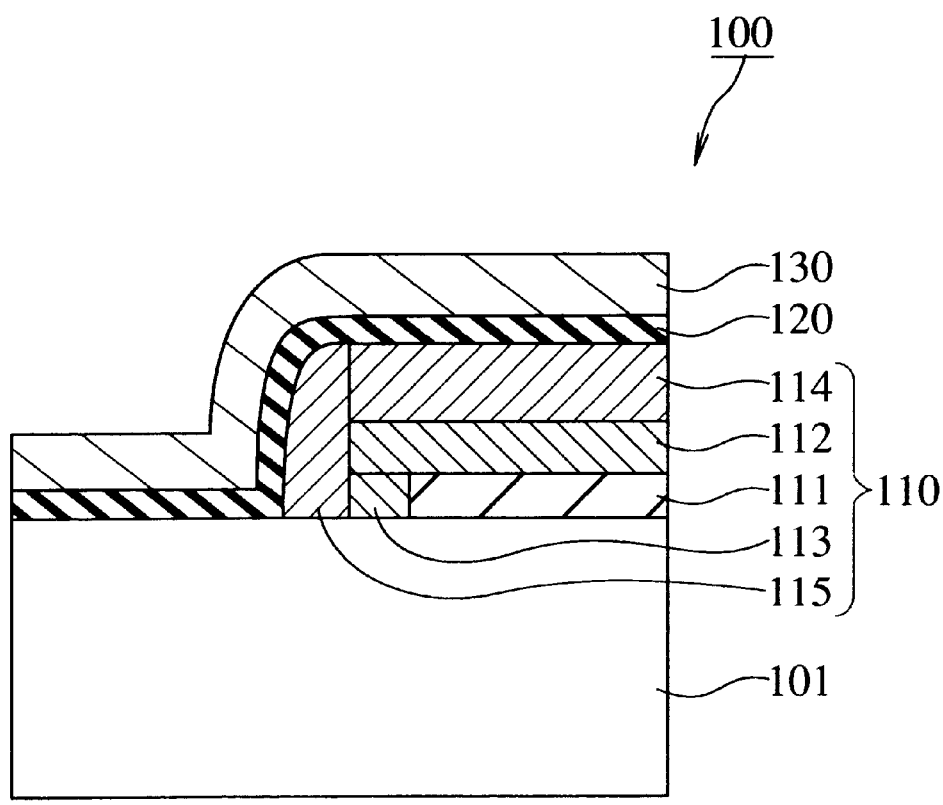
FIG. 1 is a cross-sectional view showing part of a capacitor provided in a semiconductor device according to a first embodiment.

Embodiments of the present invention are described below with reference to the drawings. It is to be understood that in the drawings, the size, shape and arrangement of the various structural constituents are shown only diagrammatically in order to enable the present invention to be understood. Also, the conditions in terms of numerical values described below are given merely by way of example.

First embodiment

The construction of a semiconductor device according to a first embodiment of the present invention will now be described. FIG. 1 is a cross-sectional view showing part of a capacitor provided in a semiconductor device according to this embodiment.

As shown in FIG. 1, in this capacitor 100, lower electrode 110 comprises: a Ti adhesive layer 111 formed on insulating film 101, a TiN barrier layer 112 formed so as to cover the upper surface of adhesive layer 111, a TiN side 113 formed so as to cover the side face of adhesive layer 111, and a Ru electrode layer 114 formed so as to cover the upper surface of barrier layer 112. In addition, there is provided an Ru side electrode 115 formed so as to cover the side face of this laminated layer.

Capacitor insulating film 120 is formed so as to cover the upper surface and side surface of lower electrode 110. For this capacitor insulating film, a high relative permittivity film or ferroelectric film may be employed consisting of for example $Ta_2O_5$ or $SrTiO_3$.

Upper electrode 130 is formed so as to cover the surface of capacitor insulating film 120. As this upper electrode 130, for example Ru may be employed.

Next, a fabricating method of a semiconductor device according to this embodiment will be described. FIGS. 2(A)–(D) are cross-sectional views showing the process of fabricating a semiconductor device shown in FIG. 1.

(1) First of all, a through-hole is formed in inter-layer insulating film 101 using the ordinary photo-lithographic technique. A contact plug 201 for the capacitor is then formed in this through-hole by filling it with a conductive material such as for example polysilicon using a deposition technique such as CVD method or sputtering method.

(2) Using for example the CVD method or sputtering method, a Ti film, TiN film and Ru film are deposited on to the inter-layer insulating film 101 so as to effect contact with this contact plug 201, in a total film thickness of for example 100 nm.

Figure 2A:
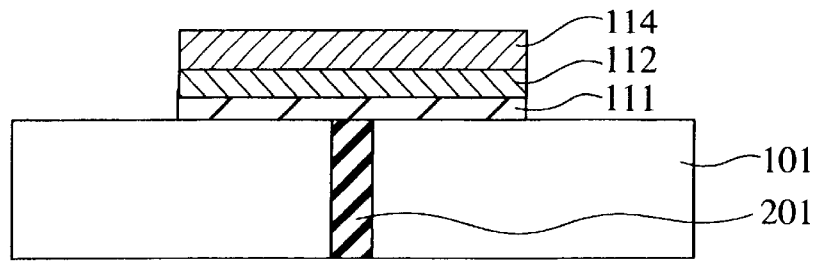
FIGS. 2(A)–2(D) are cross-sectional views showing fabricating steps of a semiconductor device shown in FIG. 1.

(3) Ti adhesive layer 111, TiN barrier layer 112 and electrode layer 114 are formed (see FIG. 2(A)) by patterning these films by ordinary photolithography. After patterning, nitriding is immediately effected in for example an atmosphere of $N_2$ gas of 650~800° C. TiN side 113 is thereby formed by nitriding the side face of the Ti adhesive layer 111. Specifically, the upper face and the side face of the Ti adhesive layer 111 are covered with a TiN film 112, 113. It should be noted that electrode layer 114 is formed of ruthenium and so is not nitrided.

Figure 2B:
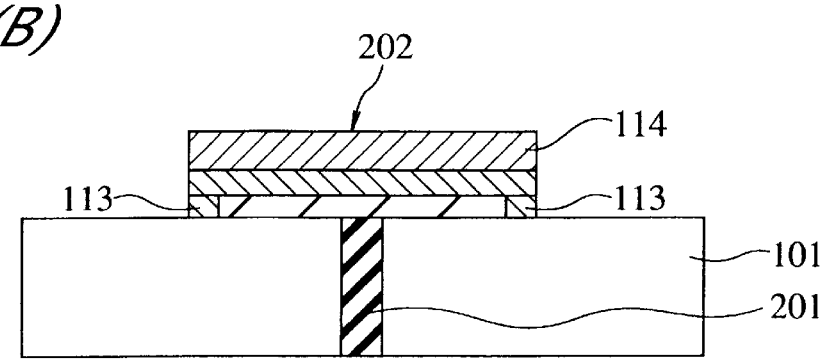

By means of these steps (1)~(3) above, as shown in FIG. 2(B), a laminated layer 202 can be formed consisting of a Ti adhesive layer 111, TiN barrier layer 112, TiN side 113 and Ru electrode layer 114.

(4) Next, ruthenium is deposited in a thickness of for example 100 nm or more on the entire surface of inter-layer insulating film 101, using for example the CVD method or sputtering method. Thus Ru side electrode 115 is formed on the side face of laminated layer 202 by etching back this Ru film using for example the RIE method.

Figure 2C:
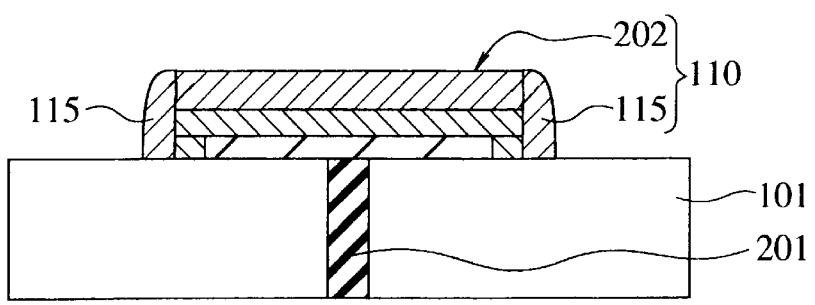

A lower electrode 110 corresponding to a storage node and consisting of laminated layer 202 and Ru side electrode 115 is thus completed by the above steps (1)~(4), as shown in FIG. 2(C).

(5) Next, using for example the CVD method or sputtering method, capacitor insulating film 120 is formed by depositing for example $Ta_2O_5$ or $SrTiO_3$ so as to cover the entire surface of the inter-layer insulating film 101 and lower electrode 110.

Figure 2D:
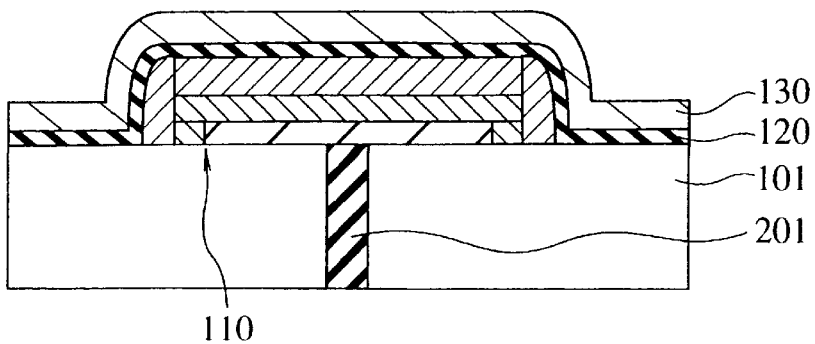

(6) An upper electrode 130 corresponding to a cell plate is then formed by depositing for example ruthenium on the entire surface of this capacitor insulating film 120, using for example the CVD method or sputtering method (see FIG. 2(D)).

(7) Finally, capacitor 100 is completed by processing upper electrode 130 constituting a cell plate.

In a semiconductor device according to this embodiment, as described above, a TiN side 113 was formed on the side face of Ti adhesive layer 111. Consequently, when oxidation of capacitor insulating film 120 is performed in the subsequent annealing step, oxidation of the Ti adhesive layer 111 can be prevented. Impairment of the ohmic characteristic between lower electrode 110 and contact plug 201 by annealing can thereby be prevented.

Also, thanks to the provision of side electrode 115 covering the side face of the laminated layer 202 in lower electrode 110, step coverage of capacitor insulating film 120 can be improved, and short circuiting of the lower electrode 110 and upper electrode 130 can thereby be prevented.

Furthermore, increase of the capacitance of capacitor 100 can be achieved since the surface area of lower electrode 110 can be increased by the provision of side electrode 115. In the trial fabrication conducted by the present inventors, it was found that, when the thickness of lower electrode 110 (thickness of laminated layer 202) was made 100 nm and the surface area of electrode layer 114 was made 0.60 $\mu m^2$, the surface area constituting the storage node (i.e. the sum of the surface area of electrode layer 114 and side electrode 115) was 0.92 $\mu m^2$. That is, by adopting the construction of this embodiment, a rate of increase of the storage node surface area of more than 1.5 times can be achieved. This rate of increase can be made even greater by making the thickness of the laminated layer 202 even more.

With the method of fabricating a semiconductor device according to this embodiment, a TiN side 113 and side electrode 115 can be formed by a simple step.

Second embodiment

Figure 3:
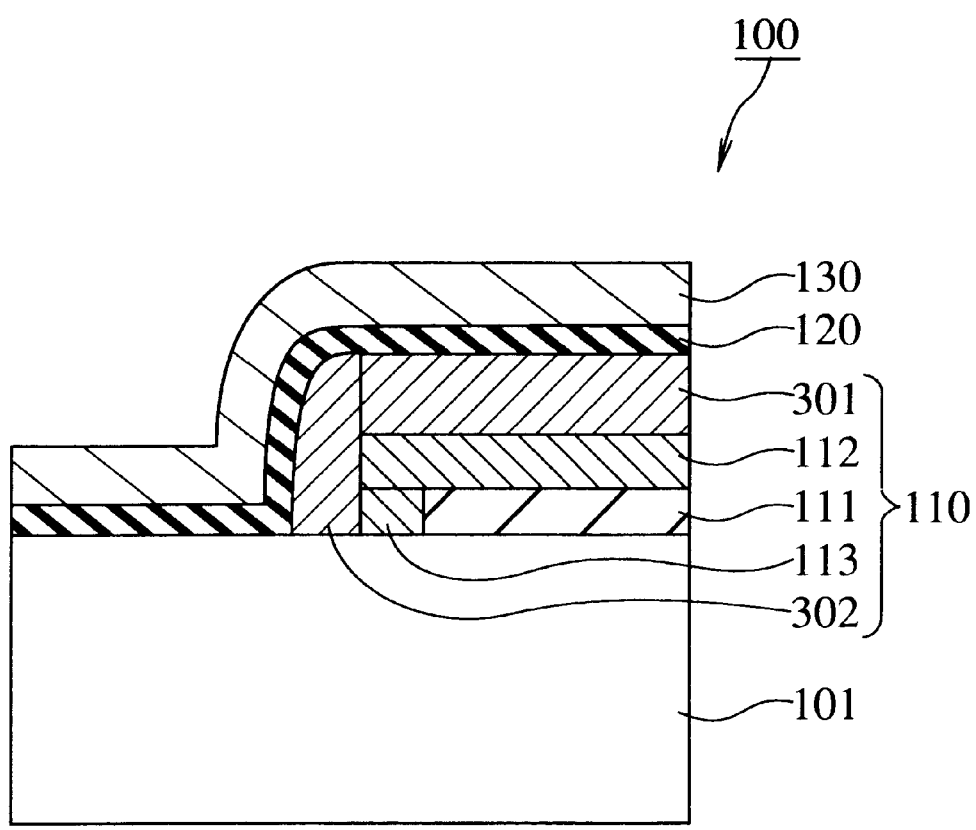
FIG. 3 is a cross-sectional view showing part of a capacitor provided in a semiconductor device according to a second embodiment.

The construction of a semiconductor device according to the second embodiment of the present invention will now be described. FIG. 3 is a cross-sectional view showing part of a capacitor provided on a semiconductor device according to this embodiment.

In FIG. 3, structural elements that are given the same reference symbols as in FIG. 1 indicate respectively the same items as in the case of FIG. 1.

In the capacitor 100 of this embodiment, electrode layer 301 is formed of Ru or $RuO_2$, and side electrode 302 is formed of $RuO_2$. Lower electrode 110 is constituted by these elements 301, 302, Ti adhesive layer 111, TiN barrier layer 112, and TiN side 113.

Capacitor insulating film 120 is constituted so as to cover the upper face and side face of lower electrode 110. For this capacitor insulating film 120, high relative permittivity film or ferroelectric film of for example $Ta_2O_5$ or $SrTiO_3$ can be employed.

Upper electrode 130 is formed so as to cover the upper surface of capacitor insulating film 120. As this upper electrode 130, for example Ru may be employed.

Next, a method of fabricating a semiconductor device according to this embodiment will be described. FIGS. 4(A)~(D) are cross-sectional views showing the steps of fabricating a semiconductor device shown in FIG. 3.

(1) First of all, a through-hole is formed in inter-layer insulating film 101 using the ordinary photo-lithographic technique. Next, a contact plug 401 for the capacitor is formed by filling this through-hole with a conductive material such as polysilicon using a deposition technique such as CVD method or the sputtering method.

(2) On inter-layer insulating film 101 there are formed a Ti film and a TiN film and, in addition, there is formed an Ru or $RuO_2$ film, so as to effect contact with this contact plug 401, using for example the CVD method or sputtering method. These films are formed so as to have a total film thickness of for example 100 nm.

Figure 4A:
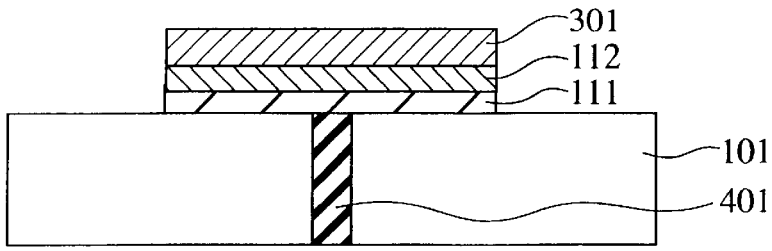
FIGS. 4(A)–4(D) are cross-sectional views showing fabricating steps of a semiconductor device shown in FIG. 3.

(3) Adhesive layer 111, barrier layer 112 and electrode layer 301 are formed by patterning these films by ordinary photo-lithography (see FIG. 4(A)). After patterning, nitriding is immediately conducted with an atmosphere of $N_2$ gas of for example 650~800° C. The side face of the Ti film is thereby nitrided, forming TiN side 113. That is, the upper surface and side surface of the Ti adhesive layer 111 are covered by TiN film 112, 113. Electrode layer 301 is formed by Ru or $RuO_2$, and so is not nitrided.

Figure 4B:
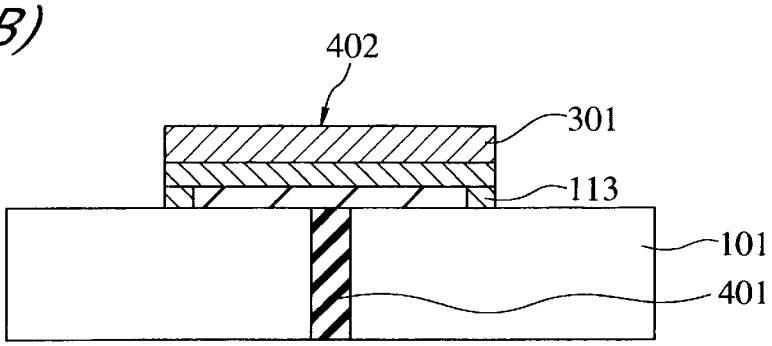

By means of the above steps (1)~(3), as shown in FIG. 4(B), a laminated layer 402 consisting of an adhesive layer 111, barrier 112, nitride side 113 and electrode layer 301 can be formed.

(4) Next, $RuO_2$ of for example a thickness of 100 nm or more is deposited on the entire surface of the inter-layer insulating film 101 by the CVD method or sputtering method, for example. Then, by etching back this $RuO_2$ film using for example the RIE method, $RuO_2$ side electrode 302 is formed on the side face of laminated layer 402.

Figure 4C:
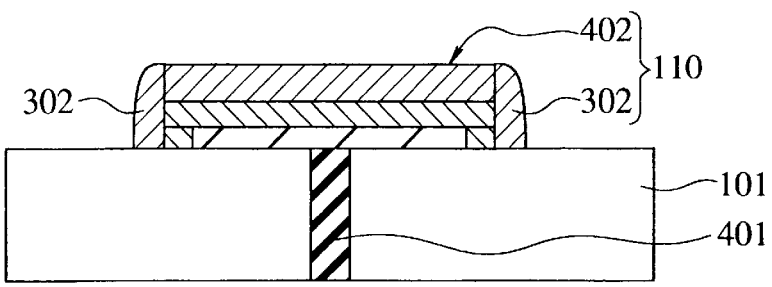

By means of the above steps (1)~(4), as shown in FIG. 4(C), a lower electrode 110 corresponding to a storage node and consisting of laminated layer 402 and side electrode 302 is completed.

(5) Next, capacitor insulating film 120 is formed by depositing for example $Ta_2O_5$ or $SrTiO_3$ so as to cover the entire surface of the inter-layer insulating film 101 and lower electrode 110, using for example the CVD method or sputtering method.

Figure 4D:
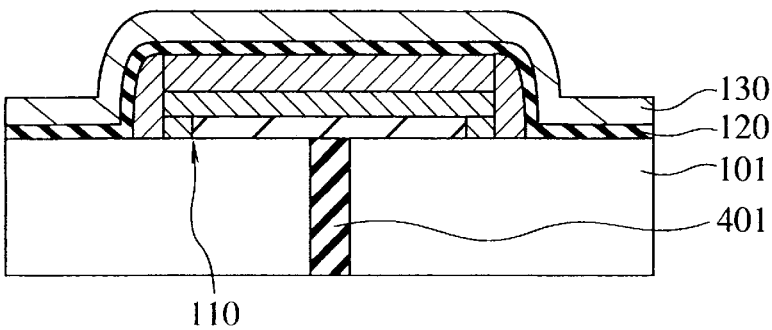

(6) Upper electrode 130 corresponding to the cell plate is formed (see FIG. 4(D)) by depositing for example ruthenium, using the CVD method or sputtering method, for example, on the entire surface of this capacitor insulating film 120.

(7) Finally, capacitor 100 is completed by processing upper electrode 130 constituting the cell plate.

Thus, with this embodiment, oxidation of electrode layer 301 or side electrode 302 on oxidation of capacitor insulating film 120 can be prevented by forming the side electrode 302 and/or electrode layer 301 of lower electrode 110 of $RuO_2$. When electrode layer 301 and side electrode 302 are oxidised, the leakage current between lower electrode 110 and upper electrode 130 is increased due to deterioration of the morphology of the upper surface of the storage node. However, with the semiconductor device according to this embodiment, there is no risk of this happening, since oxidation of the lower electrode 110 can be prevented. That is, with this embodiment, the reliability of the semiconductor device as a whole can be improved.

This embodiment is the same as the first embodiment in that oxidation of adhesive film 111 can be prevented thanks to the provision of nitride side 113, in that short circuiting of lower electrode 110 and upper electrode 130 can be prevented thanks to the provision of side electrode 302, and in that capacitance can be increased thanks to the provision of side electrode 302.

Specifically, with this embodiment, the performance of the capacitor can be improved in the same way as in the first embodiment and, in addition, reliability of the device can be raised.

Furthermore, also as in the case of the first embodiment described above, nitride side 113 and side electrode 302 can be formed by a simple step, by the method of fabricating a semiconductor device according to this embodiment.

Third embodiment

Figure 5:
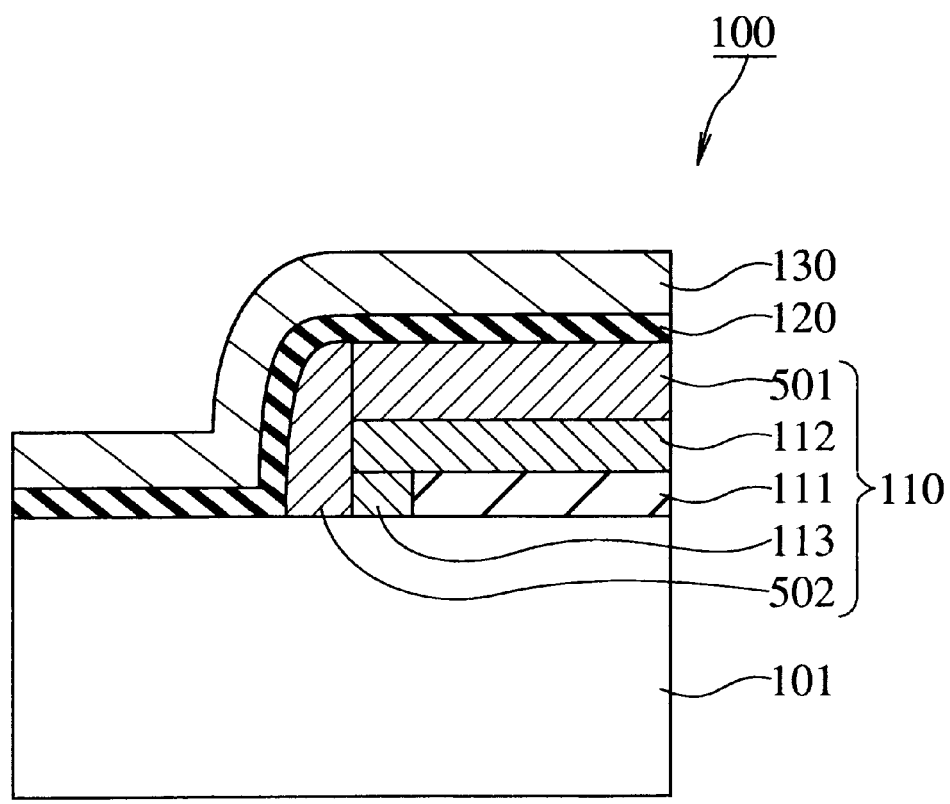
FIG. 5 is a cross-sectional view showing part of a capacitor provided in a semiconductor device according to a third embodiment.

The construction of a semiconductor device according to a third embodiment of the present invention will now be described. FIG. 5 is a cross-sectional view showing part of a capacitor provided in a semiconductor device according to this embodiment.

In FIG. 5, structural elements given the same reference symbols as in the case of FIG. 1 indicate items which are the same as in FIG. 1, respectively.

In capacitor 100 of this embodiment, electrode layer 501 and side electrode 502 are formed of Ir or $IrO_2$. Lower electrode 110 is constructed by means of these elements 501, 502, Ti adhesive layer 111, TiN barrier layer 112, and TiN side 113.

Capacitor insulating film 120 is formed so as to cover the upper surface and side surface of lower electrode 110. For this capacitor insulating film, high relative permittivity film or ferroelectric film such as for example $Ta_2O_5$ or $SrTiO_3$ may be employed.

Upper electrode 130 is formed so as to cover the surface of capacitor insulating film 120. As this upper electrode 130, for example Ru may be employed.

Next, a method of fabricating a semiconductor device according to this embodiment will be described. FIGS. 6(A)~(D) are cross-sectional views showing the steps of fabricating a semiconductor device as shown in FIG. 5.

(1) Just as in the case of the embodiments described above, a contact plug 601 is formed in inter-layer insulating film 101.

(2) Using for example the CVD method or sputtering method, a Ti film and TiN film are formed on inter-layer insulating film 101 in order to effect contact with this contact plug 601 and, in addition, Ir or $IrO_2$ films are formed. These films are formed so as to provide a total film thickness of for example 100 nm.

Figure 6A:
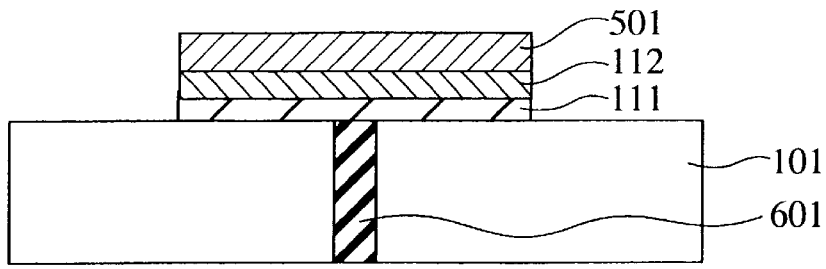
FIGS. 6(A)–6(D) are cross-sectional views showing fabricating steps of a semiconductor device shown in FIG. 5.

(3) Adhesive layer 111, barrier layer 112 and electrode layer 501 are formed (see FIG. 6(A)) by patterning these films by ordinary photolithography. After patterning, nitriding is immediately performed in a $N_2$ gas atmosphere of for example 650~800° C. The side face of the Ti adhesive layer 111 is thereby nitrided, to form TiN side 113. Specifically, the upper face and side face of the Ti film 111 are covered with a TiN film 112, 113. Electrode layer 501 is formed of Ir or $IrO_2$, and so is not nitrided.

Figure 6B:
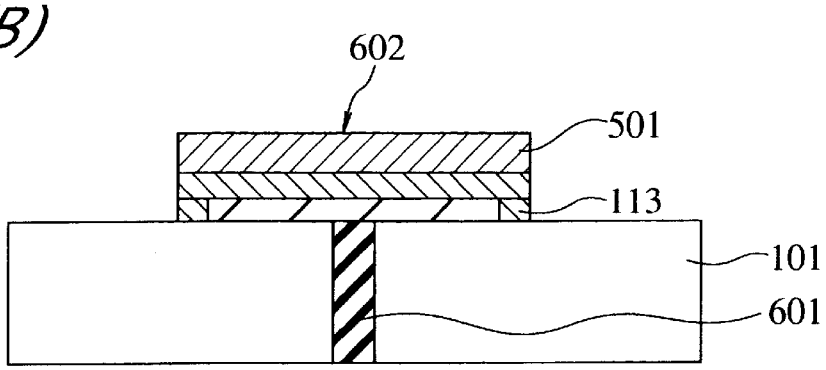

As shown in FIG. 6(B), a laminated layer 602 is formed consisting of adhesive layer 111, barrier layer 112, nitride side 113 and electrode layer 501, by means of the above steps (1)~(3).

(4) Next, using for example the CVD method or sputtering method, Ir or $IrO_2$ is deposited to a thickness of for example at least 100 nm on the entire surface of inter-layer insulating film 101. Thus, side electrode 502 of Ir or $IrO_2$ is formed on the side face of laminated layer 602 by etching back this $IrO_2$ film using for example the RIE method.

Figure 6C:
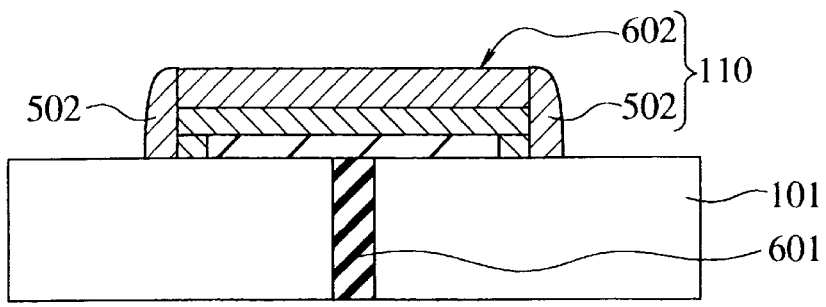

Lower electrode 110 corresponding to a storage node and consisting of laminated layer 602 and side electrode 502 as shown in FIG. 6(C) is thereby completed by the above steps (1)~(4).

(5) Next, capacitor insulating film 120 is formed by for example depositing $Ta_2O_5$ or $SrTiO_3$ so as to cover the entire surface of inter-layer insulating film 101 and lower electrode 110, using for example the CVD method or sputtering method.

Figure 6D:
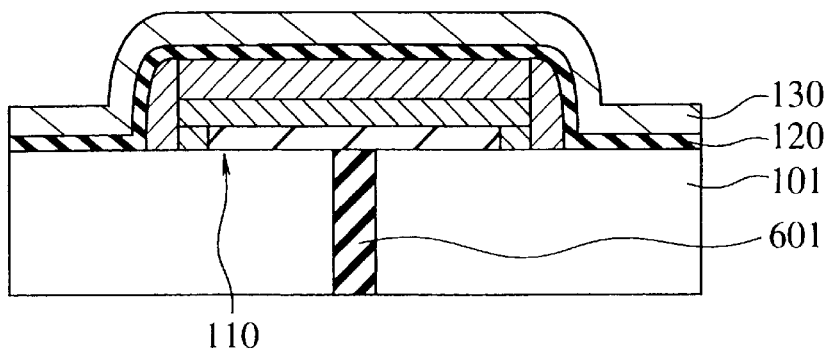

(6) Upper electrode 130 (see FIG. 6(D)) corresponding to the cell plate is formed by depositing for example ruthenium using for example the CVD method or sputtering method on to the entire surface of this capacitor insulating film 120.

(7) Finally, capacitor 100 is completed by processing the upper electrode 130 constituting the cell plate.

In this embodiment, the electrode layer 501 and side electrode 502 of the lower electrode 110 are formed of Ir or $IrO_2$, which are substances of stable physical properties. Consequently, with this embodiment, the stability of the capacitor with respect to fabricating processes can be improved and consequently the quality and reliability of the semiconductor device can be further improved compared with the embodiments described above.

When electrode layer 501 and side electrode 502 are formed of $IrO_2$, just as in the case of the second embodiment described above, oxidation of electrode layer 501 and side electrode 502 with oxidation of capacitor insulating film 120 can be prevented. Consequently, increase of leakage current between lower electrode 110 and upper electrode 130 due to deterioration of the surface morphology of the storage node can be prevented and reliability of the semiconductor device as a whole can thereby be raised.

Just as in the embodiments described above, oxidation of adhesive layer 111 can be prevented thanks to the provision of nitride side 113, short circuiting of lower electrode 110 and upper electrode 130 can be prevented thanks to the provision of side electrode 502, and capacitance can be increased thanks to the provision of side electrode 502.

Also as in the embodiments described above, nitride side 113 and side electrode 502 can be formed by a simple step by the method of fabricating a semiconductor device according to this embodiment.

Fourth embodiment

Figure 7:
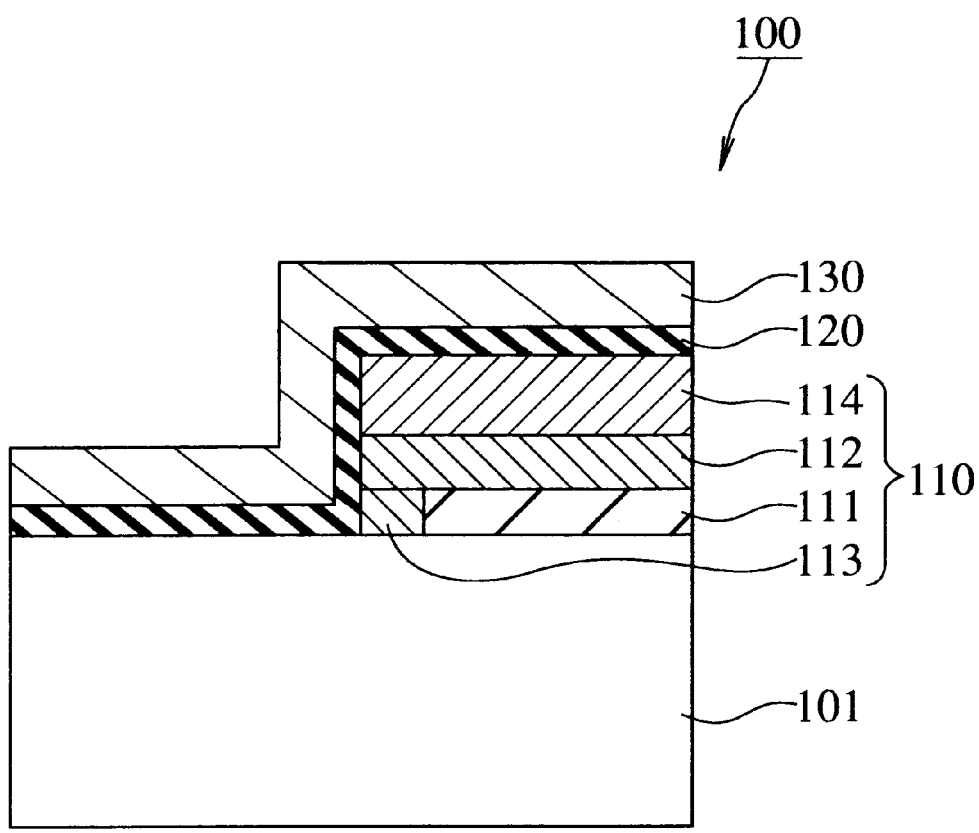
FIG. 7 is a cross-sectional view showing part of a capacitor provided in a semiconductor device according to a fourth embodiment.

The construction of a semiconductor device according to a fourth embodiment of the present invention will now be described. FIG. 7 is a cross-sectional view showing part of a capacitor provided in a semiconductor device according to this embodiment.

In FIG. 7, structural elements that are given the same reference symbols as in FIG. 1 indicate the same items as in the case of FIG. 1, respectively.

In capacitor 100 of this embodiment, lower electrode 110 is constituted by Ti adhesive layer 111, TiN barrier layer 112, TiN side 113 and Ru electrode layer 114. Specifically, capacitor 100 of this embodiment is not provided with a side electrode. Electrode layer 114 may be formed of $RuO_2$, Ir or $IrO_2$.

Capacitor insulating film 120 is formed so as to cover the upper face and side face of lower electrode 110. For this capacitor insulating film, high relative permittivity film or ferroelectric film consisting for example of $Ta_2O_5$ or $SrTiO_3$ may be employed.

Upper electrode 130 is formed so as to cover the surface of capacitor insulating film 120. For this upper electrode 130, Ru, for example, may be employed.

Figure 8A:
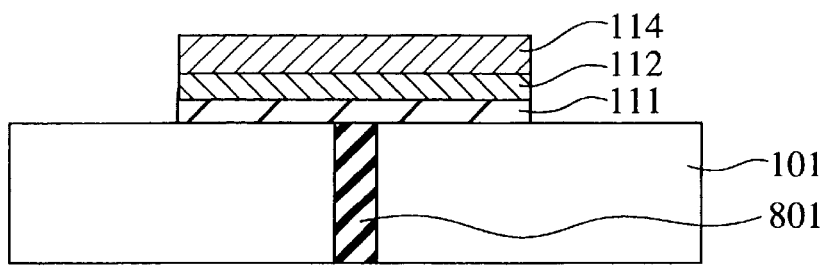
FIGS. 8(A)–8(C) are cross-sectional views showing fabricating steps of a semiconductor device shown in FIG. 7.
Figure 8B:
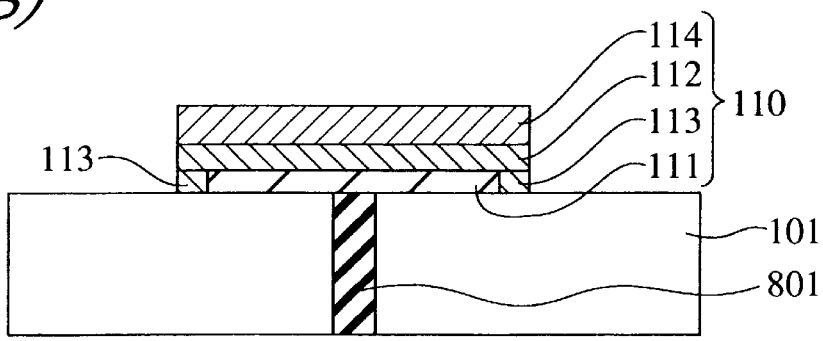
Figure 8C:
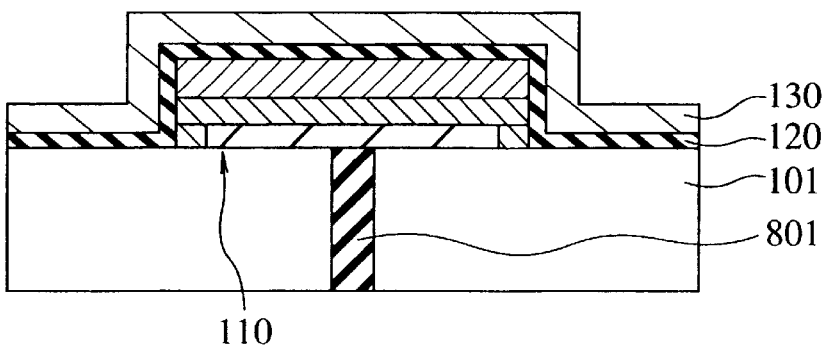
Figure 9A:
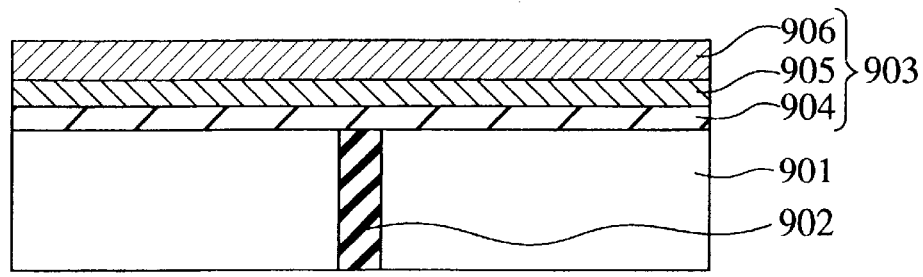
FIGS. 9(A)–9(D) are cross-sectional views given in explanation of an example of a semiconductor device and related techniques involved in its method of fabrication.
Figure 9B:
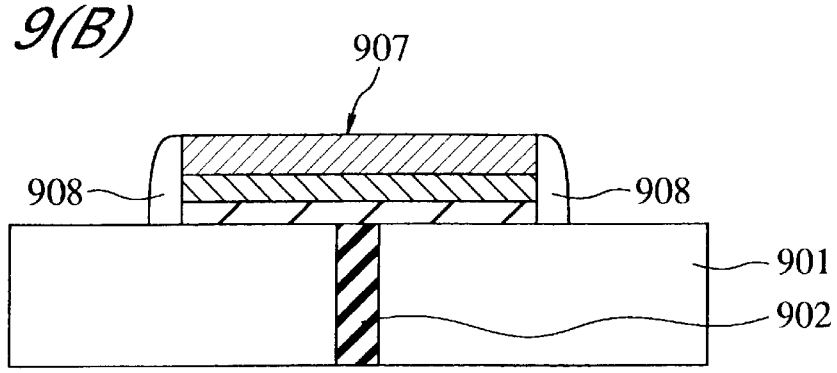
Figure 9C:
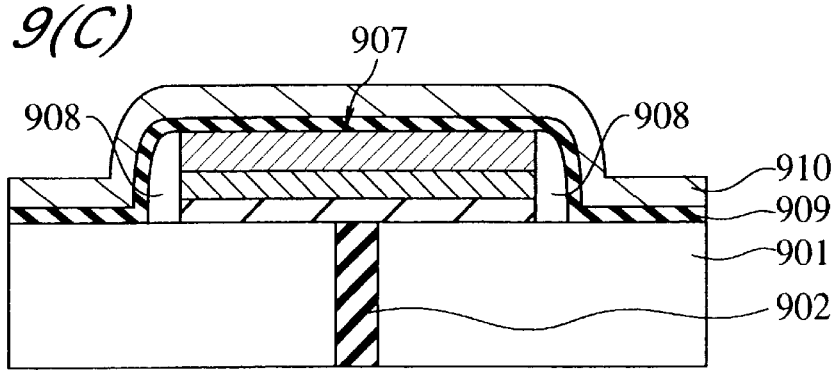
Figure 9D:
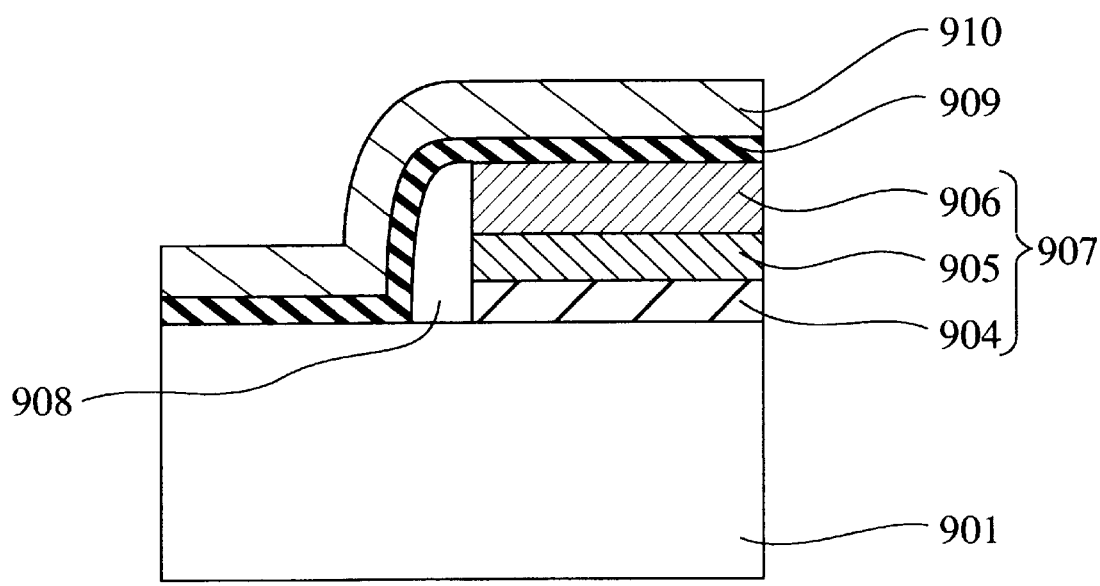

Next, a fabricating method of a semiconductor device according to this embodiment will be described. FIGS. 8(A)~(C) are cross-sectional views showing steps in the fabrication of the semiconductor device shown in FIG. 7.

(1) Just as in the embodiments described above, a contact plug 801 is formed in inter-layer insulating film 101.

(2) Using for example the CVD method or sputtering method, a Ti film and TiN film are formed on inter-layer insulating film 101 so as to effect contact with this contact plug 801, and, in addition, an Ru film (or $RuO_2$ film, Ir film or IrO$_2$ film) is formed. These films are formed such that their total film thickness is for example 100 nm.

(3) By patterning these films by ordinary photo-lithography, adhesive layer 111, barrier layer 112 and electrode layer 114 are formed (see FIG. 8(A)). After the patterning, nitriding is immediately performed in for example an N$_2$ gas atmosphere of 650~800° C. TiN side 113 is thereby formed by nitriding the side face of the Ti film. Specifically, the upper surface and the side surface of the Ti film are covered with TiN film. Since electrode layer 114 is formed of Ru, RuO$_2$, Ir or IrO$_2$, it is not nitrided.

Lower electrode 110 consisting of adhesive layer 111, barrier layer 112, nitride side 113 and electrode layer 114 can be formed as shown in FIG. 8(B) by the above steps (1)~(3).

(4) Capacitor insulating film 120 is formed by depositing for example Ta$_2$O$_5$ or SrTiO$_3$ so as to cover the entire surface of inter-layer insulating film 101 and lower electrode 110, using for example the CVD method or sputtering method.

(5) Upper electrode 130 is formed (see FIG. 8(C)) corresponding to the cell plate by depositing for example ruthenium using for example the CVD method or sputtering method on the entire surface of this capacitor insulating film 120.

(6) Capacitor 100 is completed by processing the upper electrode 130 constituting the cell plate.

Since in this embodiment a side electrode is absent, the fabricating process can be abbreviated from that of the embodiments described above and production costs can therefore be reduced.

Since nitride side 113 is provided, oxidation adhesive layer 111 can be prevented just as in the case of the first embodiment described above.

If electrode layer 114 is formed of Ir or IrO$_2$, stability of the capacitor with regard to the fabricating process can be increased in the same way as in the third embodiment described above. The quality and reliability of the semiconductor device can thereby be improved.

Just as in the case of the embodiments described above, nitride side 113 can be formed by a simple step by the method of fabrication of a semiconductor device according to this embodiment.

What is claimed is:

1. A method of fabricating a semiconductor device having a capacitor comprising:
   depositing a a first conductive material that is not nitrided on an insulating film, to form an adhesive layer;
   depositing a second conductive material that is a nitride of said first conductive material on a surface of said first conductive material, to form a barrier layer;
   depositing a third conductive material that is more difficult to be nitrided than said first conductive material on a surface of said second conductive material, to form an electrode layer;
   patterning said adhesive layer, said barrier layer and said electrode layer;
   forming a nitride side on a side face of said adhesive layer by heating said adhesive, barrier and electrode layers in an atmosphere of nitrogen gas,
   said adhesive, barrier and electrode layers and said nitride side forming a lower electrode;
   depositing an insulating material so as to cover an upper surface and a side surface of said lower electrode, to form a capacitor insulating film; and
   depositing a fourth conductive material so as to cover a surface of said capacitor insulating film, to form an upper electrode.

2. The method of fabricating a semiconductor device according to claim 1, wherein said first conductive material is formed so as to contact a contact plug formed in the insulating film.

3. The method of fabricating a semiconductor device according to claim 1, wherein said first conductive material is titanium, and said second conductive material is titanium nitride.

4. The method of fabricating a semiconductor device according to claim 1, further comprising forming a side electrode covering side faces of said barrier layer, said electrode layer and said nitride side, said side electrode being part of said lower electrode.

5. The method of fabricating a semiconductor device according to claim 4, wherein said side electrode is formed by depositing conductive material on an entire surface of a substrate of the semiconductor device and etching back the conductive material film, after formation of said nitride side.

6. The method of fabricating a semiconductor device according to claim 4, wherein said electrode layer and said side electrode are ruthenium.

7. The method of fabricating a semiconductor device according to claim 4, wherein said electrode layer is ruthenium or ruthenium oxide, and said side electrode is ruthenium oxide.

8. The method of fabricating a semiconductor device according to claim 4, wherein said electrode layer and said side electrode are iridium.

9. The method of fabricating a semiconductor device according to claim 4, wherein said electrode layer is iridium or iridium oxide, and said electrode is iridium oxide.

10. The method of fabricating a semiconductor device according to claim 1, wherein said electrode layer is ruthenium, ruthenium oxide, iridium or iridium oxide.

11. The method of fabricating a semiconductor device according to claim 1, wherein said capacitor insulating film is Ta$_2$O$_5$, SrTiO$_3$ or (Ba$_{(x)}$Sr$_{(1-x)}$)TiO$_3$.

12. The method of fabricating a semiconductor device according to claim 1, wherein said upper electrode is ruthenium.

13. A method of fabricating a capacitor comprising:
    forming an adhesive layer on an insulating substrate;
    forming a barrier layer on the adhesive layer;
    forming an electrode layer on the barrier layer;
    patterning the adhesive, barrier and electrode layers;
    forming a nitride side wall on a side face of the patterned adhesive layer,
    the adhesive, barrier and electrode layers and the nitride side wall being a lower electrode;
    forming a capacitor insulating material on upper and side surfaces of the lower electrode; and
    forming an upper electrode on the capacitor insulating material.

14. The method of fabricating a capacitor of claim 13, further comprising forming a side electrode layer as part of the lower electrode, on side faces of the patterned barrier and electrode layers and on the nitride side wall, prior to said forming of the capacitor insulating material.

15. The method of fabricating a capacitor of claim 14, wherein the side electrode layer is formed by depositing a conductive material on side faces of the patterned barrier and electrode layers, the nitride side wall, an upper surface of the patterned electrode layer and the insulating substrate and etching back the conductive material.

16. The method of fabricating a capacitor of claim 14, wherein the electrode layer and the sidewall electrode layer are ruthenium.

17. The method of fabricating a capacitor of claim 14, wherein the electrode layer is ruthenium or ruthenium oxide, and the side electrode layer is ruthenium oxide.

18. The method of fabricating a capacitor of claim 14, wherein the electrode layer is iridium or iridium oxide, and the side electrode layer is iridium oxide.

19. The method of fabricating a capacitor of claim 13, wherein the adhesive layer is formed on the insulating substrate to contact a contact plug formed through the insulating substrate.

20. The method of fabricating a capacitor of claim 13, wherein the adhesive layer is formed by deposition of titanium on the insulating substrate and the barrier layer is formed by deposition of titanium nitride on the adhesive layer.

* * * * *